(12) United States Patent
Fautz et al.

(10) Patent No.: US 10,345,399 B2
(45) Date of Patent: Jul. 9, 2019

(54) METHOD AND LOCAL COIL SYSTEM FOR PRODUCING A MAGNETIC RESONANCE RADIO FREQUENCY FIELD

(71) Applicants: Hans-Peter Fautz, Forchheim (DE); Wolfgang Renz, Erlangen (DE); Franz Schmitt, Erlangen (DE)

(72) Inventors: Hans-Peter Fautz, Forchheim (DE); Wolfgang Renz, Erlangen (DE); Franz Schmitt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 1006 days.

(21) Appl. No.: 14/245,181

(22) Filed: Apr. 4, 2014

(65) Prior Publication Data

US 2014/0300355 A1 Oct. 9, 2014

(30) Foreign Application Priority Data

Apr. 5, 2013 (DE) .................. 10 2013 206 055

(51) Int. Cl.
*G01R 33/28* (2006.01)
*G01R 33/34* (2006.01)
*G01R 33/36* (2006.01)
*G01R 33/3415* (2006.01)

(52) U.S. Cl.
CPC ....... *G01R 33/28* (2013.01); *G01R 33/34046* (2013.01); *G01R 33/3664* (2013.01); *G01R 33/3415* (2013.01)

(58) Field of Classification Search
CPC .............. G01R 33/28; G01R 33/34046; G01R 33/3415; G01R 33/3664; G01R 33/56383; G01R 33/56375
See application file for complete search history.

(56) References Cited

U.S. PATENT DOCUMENTS

| 9,739,854 B2 | 8/2017 | Horio |
| 2004/0155656 A1 | 8/2004 | Leussler |
| 2005/0264288 A1 | 12/2005 | Campagna et al. |

(Continued)

FOREIGN PATENT DOCUMENTS

| CN | 1959428 A | 5/2007 |
| CN | 101903790 A | 12/2010 |

(Continued)

OTHER PUBLICATIONS

Chinese Office Action for related Chinese Application No. 201410119370.7 dated Jun. 20, 2016, with English Translation.

(Continued)

*Primary Examiner* — Rishi R Patel
(74) *Attorney, Agent, or Firm* — Lempia Summerfield Katz LLC (57) ABSTRACT

A magnetic resonance RF field is produced in a magnetic resonance imaging system that includes a main magnetic field apparatus and an object-bearing table movable relative to the main magnetic field apparatus and on which a local coil system is arranged. The local coil system includes a plurality of transmission elements. A current location of the object-bearing table relative to the main magnetic field apparatus is established. The transmission elements are automatically connected based on the current location of the object-bearing table.

20 Claims, 6 Drawing Sheets

(56) References Cited

U.S. PATENT DOCUMENTS

| | | | |
|---|---|---|---|
| 2006/0152220 A1* | 7/2006 | Nabetani | G01R 33/3415 324/309 |
| 2007/0103157 A1 | 5/2007 | Campagna | |
| 2008/0211502 A1 | 9/2008 | Arnold et al. | |
| 2008/0218168 A1 | 9/2008 | Takagi | |
| 2008/0265890 A1 | 10/2008 | Graesslin et al. | |
| 2008/0290870 A1* | 11/2008 | Misic | G01R 33/3415 324/318 |
| 2008/0309340 A1 | 12/2008 | Cho et al. | |
| 2010/0277174 A1 | 11/2010 | Van Den Brink et al. | |
| 2011/0057652 A1 | 3/2011 | Hoecht et al. | |
| 2011/0128001 A1 | 6/2011 | Nagasawa et al. | |
| 2011/0215803 A1 | 9/2011 | Bitz et al. | |
| 2014/0055136 A1* | 2/2014 | Leussler | G01R 33/3415 324/309 |
| 2014/0300355 A1 | 10/2014 | Fautz | |

FOREIGN PATENT DOCUMENTS

| | | |
|---|---|---|
| CN | 102138791 A | 8/2011 |
| CN | 101297213 B | 12/2011 |
| DE | 102005019859 | 12/2005 |
| DE | 102007010274 | 9/2008 |
| DE | 102008012966 | 12/2008 |
| DE | 102010011968 | 9/2011 |
| JP | H03236829 A | 10/1991 |
| JP | H0435645 A | 2/1992 |
| JP | H08266507 A | 10/1996 |
| JP | H09201346 A | 8/1997 |
| JP | 2004526547 A | 9/2004 |
| JP | 2008246192 A | 10/2008 |
| JP | 2010162298 A | 7/2010 |
| JP | 5886414 B2 | 3/2016 |
| WO | WO2013024449 A1 | 2/2013 |

OTHER PUBLICATIONS

German Office Action dated Sep. 10, 2013 in corresponding German Patent Application No. DE 10 2013 206 055.6 with English translation.

Japanese Office Action for Japanese Application No. 2014-078702, dated Dec. 22, 2017.

Japanese Grant Decision for Japanese Application No. 2014-078702, dated Oct. 9, 2018.

\* cited by examiner

METHOD AND LOCAL COIL SYSTEM FOR PRODUCING A MAGNETIC RESONANCE RADIO FREQUENCY FIELD

This application claims the benefit of DE 102013206055.6, filed on Apr. 5, 2013, which is hereby incorporated by reference in its entirety.

BACKGROUND

The disclosed embodiments relate to a method for producing a magnetic resonance radio frequency (RF) field in a magnetic resonance imaging system.

Magnetic resonance tomography scanners are imaging systems based on magnetic resonance measurement of nuclear spins. Magnetic resonance tomography scanners are well established and successful in versatile applications. In magnetic resonance image acquisition, a strong static main magnetic field $B_0$ is used to initially align and homogenize magnetic dipoles to be examined. A de-phasing or relaxation time after a deflection of the magnetization from the initial alignment is established in order to determine material properties of an examination object to be imaged. Thus, different relaxation mechanisms or relaxation times, which are typical for the material, may be identified.

The deflection is achieved by a number of RF pulses, the so-called $B_{1+}$ field, which are tuned to the Larmor frequency of the dipoles to be excited. For the purposes of differentiation, the magnetic field emitted by the body itself (after excitation by a $B_{1+}$ field) is therefore referred to as $B_{1-}$ field. The Larmor frequency depends on the properties of the examined material and scales with the strength of the main magnetic field $B_0$. Electromagnetic RF pulses having a Larmor frequency of 42.6 MHz and corresponding multiples thereof are often used for magnetic resonance measurements on biological examination objects. The value of 42.6 MHz corresponds with the Larmor frequency of proton spins in a main magnetic field $B_0$ with a strength of 1 T. The multiplication factor corresponds with the strength of the main magnetic field $B_0$ in T.

Ultra-high field magnetic resonance imaging scanners with a main magnetic field strength of 7 T have been developed. Such scanners provide an increase in the magnetic flux density, but with a significant increase in the power requirements of the transmission coils. In body-coil arrangements, the transmission power scales with the square of the strength of the main magnetic field. Therefore, if the strength of the main magnetic field is increased fourfold, the transmission power of the RF coil has to be increased by a factor of 16. On one hand, the increase leads to a significant increase in energy costs. On the other hand, the patient is exposed to a strong electromagnetic field, leading to a significant increase in a specific absorption rate (SAR) value. Moreover, the electromagnetic field produced by the body coil is not restricted to the examination region. Regions of the patient not to be examined are also exposed. Still further, the homogeneity of the RF field produced by a body coil in the examination object decreases with increasing magnetic field strength. The decrease may be traced back to dielectric effects within the examination object.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the disclosed embodiments may improve the operation of a local coil system, e.g., a local coil system in an ultra-high field magnetic resonance imaging scanner. Optimized emission of electromagnetic radiation may be provided.

The disclosed embodiments relate to a method to produce a magnetic resonance RF field in a magnetic resonance imaging system that includes a main magnetic field apparatus and an object-bearing table movable relative to the main magnetic field apparatus. For example, the object-bearing table may be configured to be moved or displaced along a longitudinal axis of the table relative to a housing of the main magnetic field apparatus.

The MRI imaging system used in the method includes a local coil system arranged on the object-bearing table. The local coil system, e.g., a transmission local coil system, includes at least one local coil, on which a plurality of transmission elements (e.g., at least two transmission elements) for producing the $B_{1+}$ field are arranged. The local coil system may be securely connected to the object-bearing table. Alternatively, the local coil system may lie on the object-bearing table or on an examination object arranged on the table.

If the local coil system is securely connected to the object-bearing table, a predetermined distance between the transmission elements and the examination object may be achieved. For example, the object-bearing table may have fitting holders to this end.

A "transmission element" means a coil or antenna that transmits an RF field in the direction of a magnetic resonance measurement space or a tunnel for holding an examination object of the magnetic resonance imaging system. The RF field emitted by each individual transmission element may be directed to a region of the examination object or a measurement region, which are described in more detail below. The transmission elements may be installed securely on the object-bearing table and have a fixed location in relation to the object-bearing table. Therefore, the transmission elements of the local coil system may move with the table when the object-bearing table is moved.

In one aspect, a current location of the object-bearing table is established relative to the main magnetic field apparatus. There is an automatic connection of the transmission elements depending on the current location of the object-bearing table.

An "automatic connection" means an independent connection according to predetermined criteria provided or controlled by a control apparatus for the local coil system. For example, the automatic connection may be predetermined in an actuation sequence (scanning protocol) for the MRI imaging system.

In some cases, not all transmission elements are switched on or activated during a measurement based on the magnetic resonance RF field. Instead, individual transmission elements may be activated and other individual elements may be deactivated. For example, such selective connecting of the transmission elements may be dependent on an examination object, e.g., a human or animal, of which image data is produced via the magnetic resonance RF field. For example, during a measurement of the examination object, only those transmission elements with RF fields aligned relative to the examination object may be activated. As a result, production of an ideal image of the examination object may be possible. Criteria may be predetermined to this end.

The local coil system may have reception elements, which may be configured for a spatially resolved measurement of MR images. The contrasts in the measurement are based upon different relaxation times of the magnetization caused by a nuclear spin (the $B_{1-}$ field) in an examination object. The transmission elements may also receive a magnetic resonance signal. However, in a "transmission local coil system", the transmission elements are configured to only transmit an RF field. As a result, the transmission local coil system may be complemented by a reception local coil system. The local coil system with the transmission, the reception elements, or both the transmission elements and the reception elements, may surround a cavity in which an examination object may be placed for a measurement. The transmission coil usually has a distance from the body determined by comfort and patient safety factors. If the distance becomes too large, the transmission power requirements increase. Therefore, an ideal distance that represents the best possible compromise between patient comfort and patient safety on the one hand and transmission power requirements on the other hand may be found. Reception coils may be placed as close as is physically possible to the examination object in order to achieve a best possible signal-to-noise ratio.

The main magnetic field apparatus of the magnetic resonance imaging system may include a magnetic coil for producing a main magnetic field, which has a homogeneity volume with a largely homogeneous field distribution. A direction of the magnetic field and a magnetic flux density in the magnetic field each are consequently largely uniform. During a measurement of an examination object using the local coil system, at least one region of the examination object lies in the homogeneity volume. Thus, a selection of transmission elements activated during a subsequent measurement may depend on the position of the local coil system relative to the examination object (determined by an arrangement of the examination object on the object-bearing table) and depend on the positioning of the examination object in the homogeneity volume (determined by a displacement of the object-bearing table relative to the main magnetic field apparatus). These parameters may be predetermined criteria for automatic connection of the local coil system.

The method provides or ensures a reduced production of electromagnetic radiation while having optimized excitation fields ($B_{1+}$) for the examination volume and the specific application. Moreover, the method has significantly reduced energy consumption of the transmission elements as a result of the overall reduced transmission power.

Some embodiments also relate to a local coil system for producing a magnetic resonance RF field. The local coil system includes a plurality of transmission elements and a power distributor for distributing an electrical signal from a number of input channels into the power distributor to the transmission elements via distributor channels. The power distributor includes a signal combiner for combining incoming signals to form mixed signals, a signal divider for splitting an incoming signal into a number of partial signals, a signal switch for switching between distributor channels, or any combination of the signal combiner, the signal divider, and the signal switch.

The local coil system may include a matrix or array of local coils. Each local coil of the array of local coils has a plurality of transmission elements. The local coil system may extend over the entire object-bearing table and surround a patient lying thereon. Individual local coils, individual transmission elements, or both individual local coils and individual transmission elements may be actuated or activated or deactivated separately, e.g., independently of one another. A transmission power of each individual transmission element may be varied.

The distribution of an electrical signal may include transmission of electrical pulses emanating from many input channels to a few transmission elements. For example, a signal combiner may combine electrical signals that, for example, are fed to the power distributor from two input channels or originate from two distributor channels of the power distributor. The signal combiner may combine the signals to form a mixed signal transmitted on a single distributor channel. The distributor channel may lead to, e.g., a single transmission element. Conversely, a signal divider may split an electrical signal, e.g., coming from an input channel or a distributor channel, to two or more distributor channels. A signal switch may, e.g., alternatively activate, deactivate, or both activate and deactivate one of two distributor channels such that an incoming signal is merely transmitted in a single one of the two distributor channels. Therefore, a number of actuated transmission elements may be larger than a number of input channels, from which electrical signals flow into the power distributor. In this case, the power distributor divides the incoming signals.

The power distributor may also include a cascade of signal combiners, signal dividers, signal switches, or a combination thereof, which enable combining, distributing, switching, or a combination thereof, of incoming electrical signals in any sequence and selection. To this end, the power distributor may have multiple occurrences of each of the three aforementioned components or have these in different configurations, which are connected in a suitable manner. The power distributor may be connected to the aforementioned control system, which emits corresponding control commands thereto.

The local coil system enables completely flexible direction of incoming electrical signals to potentially each one of the transmission elements and hence any connection of previously selected transmission elements.

In another aspect, a magnetic resonance imaging system includes a main magnetic field apparatus, an object-bearing table that may move relative to the main magnetic field apparatus, a local coil system arranged on the object-bearing table and including a plurality of transmission elements to produce a magnetic resonance RF field, a location establishment unit to establish a current location of the object-bearing table relative to the main magnetic field apparatus, and a switching apparatus connected to the location establishment unit to connect the transmission elements depending on the current location of the object-bearing table.

For example, the switching apparatus may include a control system and a power electronics apparatus, actuated by the control system, with a number of RF generators and power amplifiers, which will be described in more detail below. For example, the location establishment unit may be a component of the control system of the magnetic resonance imaging system.

The local coil system may include a plurality of specialized local coil units, each of which has a plurality of transmission elements. A plurality of transmission elements are activated, and each transmission element of the plurality of transmission elements is a respective component of a different local coil unit. The local coil units may realize a predetermined distance between the transmission elements and the examination object.

Each specialized local coil unit may be part of a group of local coil units adapted to, e.g., an anatomical region of a patient. For example, a group of local coil units may be a head coil, a cervical vertebral column coil, a spine coil, a pelvic coil, a prostate coil, a leg, knee, arm or hand coil, a cardiac coil, a breast coil, an abdomen coil, a thorax coil, a shoulder coil or a hip coil.

Individual transmission elements may be connected depending on a position of a defined region of the object-bearing table relative to a measurement region. The position may be a predetermined criterion for automatic connection.

The "measurement region" means a spatial region disposed in the homogeneity volume of the main magnetic field. Magnetic resonance measurement signals may be detected from the homogeneity volume with the aid of a reception system of the MRI imaging system. Thus, the measurement region is the spatial region from which magnetic resonance measurement signals may be detected with sufficient signal strength such that reconstruction of image data is possible. For example, the spatial region is established by the currently active, selected, or available reception elements of the reception system. Therefore, the measurement region forms a subset of the homogeneity volume. For example, the measurement region may be configured as a disk-shaped layer. For example, a slice image of an examination object may be produced based on the disk-shaped layer. The measurement region may also have the shape of a cuboid ("slab"), which has a spatial encoding (e.g., a specific phase encoding, a specific readout direction, or both) in a specific selection direction.

For example, the "defined region" of the object-bearing table may be a point at which an examination object or a region of the examination object is disposed, which is intended to be measured in a magnetic resonance imaging recording with a specific interest in relation to the findings. When the object-bearing table is displaced, the defined region moves with the table. Connection of individual transmission elements, e.g., transmission elements selected from a plurality, may mean targeted activation and deactivation at any time. The interest in relation to the findings may lie in a predetermined analysis to be implemented, such as the examination of a specific tissue, tumor, organ (e.g., heart, lung, etc.) or else a predetermined contrast type, e.g., measuring a T1 or T2 contrast. The predetermined analysis may therefore form a further predetermined criterion for automatic connection. Application examples, in which the table or the examination object moves (such that different transmission elements may be added or switched off due to the movement), may come from the whole body field, e.g., morphometric imaging (T1, T2 contrast, etc.) of the vertebral column or of the whole body, or else MR angiographies of the whole body or part of the body (from the thorax to the legs or from the thorax to the head). However, additionally there also are examples in which flexible switching of the transmission elements within a recording is useful without the examination object moving, e.g. for perfusion measurements, in which a magnetization preparation takes place in a different spatial region than the spatially resolved imaging.

A measurement of an examination object using the local coil system is regularly brought about in such a way that at least part of the examination object is disposed in the homogeneity volume. The extent of the homogeneity volume may be limited. All transmission elements of the local coil system may thus need not be activated during a measurement. In general, the transmission elements emit an RF field in a fixed alignment in the direction of a measurement region. In the case of a specific distance of the emission point of the RF field (e.g., of the point of the transmission element) from the homogeneity volume, the transmission point may not be able to be used for a measurement of the examination object in certain circumstances. Therefore, the distance of the transmission point of the RF field may be employed as a criterion for automatic connection.

In particular, the B1+ field produced by a specific transmission element in the homogeneity volume depends on the structure of the transmission element and the examination object, and substantially also on the distance between the transmission element and the examination volume. For example, a distance threshold may be predetermined in a detailed manner, with the transmission elements not being activated if the distance threshold is exceeded.

A more complex and precise decision criterion is obtained by including the $B_{1+}$ maps ("$B_1$ map"), which are either simulated or measured, of the individual transmission elements in the homogeneity volume. If a certain efficiency threshold is undershot (the efficiency threshold may be, e.g., a SAR value produced per produced flip angle and time), individual coil elements may be connected (e.g., activated) (or not activated if it is exceeded). Transmission elements may be added. The transmission elements may produce a comparatively small $B_{1+}$ amplitude in the homogeneity volume and therefore produce a small flip angle, but which may contribute to SAR reduction within or outside of the examination volume.

For example, a distance threshold may be predetermined in this respect. The transmission elements are not activated if the threshold is exceeded. Alternatively or additionally, the angle of intersection of a central axis of the RF field with the measurement region may also be a predetermined criterion. That is to say, a minimum angle threshold for the angle of intersection may be determined, with the transmission elements not being activated if the threshold is undershot.

In the case of, for instance, a step-by-step displacement of the object-bearing table relative to the main magnetic field, the apparatus may always activate those transmission elements from a matrix of transmission elements in succession. The transmission elements are currently disposed relative to the measurement region such that the transmission elements (e.g., in the case of a given maximum transmission power or a given SAR value) produce a (target) RF field (at the point of the examination object or of the defined region) with sufficient field strength. Therefore, a position of (an emission point of) a magnetic resonance RF field relative to the main magnetic field apparatus may be kept constant during a measurement procedure, even though the position of the examination region or of the defined region changes relative to the main magnetic field apparatus. For example, selected segments of an examination object may be excited in succession and measured in a subsequent step. Therefore, initially a first segment may be excited and measured by a first number of transmission elements and, subsequently, a second segment may be excited and measured with a different number of transmission elements.

At least one transmission element may be connected depending on a position relative to a target volume segment of a patient target volume of a patient in the measurement region.

The "patient target volume" means a region of a patient intended to be excited, measured and, in a subsequent step, displayed. For example, the patient target volume may be a vessel or an organ, e.g., a heart or a kidney of a human or animal. The "target volume segment" forms a section or a subset of the patient target volume disposed in the measurement region during a measurement. Accordingly, the target volume segment may be described as an intersection between the patient target volume and the measurement region.

A position of a patient on the object-bearing table may be kept constant during a measurement of a patient. Then, the patient is always moved upon a displacement or movement of the object-bearing table. A position of the patient target volume relative to the measurement region is also variable in the case where the measurement region is constant. A transmission element therefore is connected depending on a current position of the transmission element in relation to the patient target volume or a target volume segment.

For example, a transmission element may be activated if the transmission element is immediately adjacent to a target volume segment or is disposed within a defined minimum distance from the measurement region. The minimum distance ensures that the aforementioned sufficient field strength is maintained. The transmission elements therefore may be connected such that transmission elements situated further away from the target volume segment than one or more directly adjacent transmission elements are kept inactive due to specific further factors. More precise connection of the transmission elements is provided.

The transmission element may be connected depending on an extent of the patient target volume in the measurement region.

The "extent" of the patient target volume in the measurement region means a three-dimensional extent of the patient target volume in the form of a length, width and height, e.g., in three spatial directions, that, e.g., an organ or an organ segment assumes within a preselected measurement region. For example, the information relating to the three spatial directions may be coupled to the reference system of the object-bearing table and encoded in the form of spatial coordinates. Thus, the extent represents a position and a volume of the intersection of the patient target volume with the measurement region. For example, when setting the measurement region as a disk-like layer that passes through a thorax of a patient, a heart to be measured may constitute a fraction of the measurement region. In that case, it may not be useful to activate transmission elements. The directed RF field of the transmission elements cannot be used or does not have to be used for measuring the heart. Thus, a contour, a topographic profile or a relief of the target volume may be established, e.g., in a preceding overview measurement of the patient. The contour, the topographic profile, or the relief represent the extent of the target volume segment in the measurement region from different perspectives or spatial directions of emission points of the RF field.

If, for instance, a slice image of the thorax of a patient is to be produced during a primary measurement of the patient target volume, a large number of transmission elements may be activated. The transmission elements are grouped around the layer to be measured so that a homogeneous magnetic resonance RF field may be produced for measuring the comparatively large extent here of the patient target volume.

For example, a first number of active transmission elements of a specialized local coil unit and a second number of active transmission elements of a further specialized local coil unit may contribute to this high number of transmission elements. It is not necessary for all transmission elements of the respective local coil units to be activated in order to contribute to this high number.

The transmission elements of the local coil system may be arranged along an x-direction, y-direction and z-direction of the object-bearing table. The arrangement may not only be along a longitudinal extent, but also along a transverse extent, height extent, or both a transverse extent and a height extent, of the table. When determining a shoulder region as patient target volume, one or more transmission elements in a position relative to the shoulder region may be activated and provide (e.g., ensure) an ideal excitation (e.g., in accordance with a predetermined target magnetization) of the current patient target volume segment to be measured. Individual suitable transmission elements from, e.g., a three-dimensionally distributed matrix of transmission elements are respectively activated from the x-direction, the y-direction and the z-direction. When activating a plurality of transmission elements, the RF fields of the respective transmission elements then superpose to a larger RF field.

According to one embodiment, the transmission element is connected depending on a previously carried out pre-measurement of the patient.

The "pre-measurement" may be an overview measurement of the patient implemented, e.g., to localize the patient target volume in the body of the patient. The pre-measurement may also be a complete measurement of the patient target volume conducted with a different interest in relation to the findings. Information about a quality, e.g., homogeneity, of a magnetic resonance RF field emitted by the transmission elements may be established in the pre-measurement.

The pre-measurement may include establishing a field distribution by a number of transmission elements of the local coil system, at least in a homogeneity volume. For example, all transmission elements disposed in the region of the homogeneity volume or that contribute to the B1 field in the homogeneity volume may be activated.

Parameters may be adapted for a subsequent primary measurement in regions of the RF field that does not have sufficient quality. The insufficient quality may arise from shadowing of the RF field by peculiarities of the excited tissue or from an unfitting setting of the transmission power of the transmission elements. These parameters may include, e.g., adapting the amplitude, phase shift, or both amplitude and phase shift, of the transmission elements, or a specific activation or deactivation of transmission elements, which reduces or avoids shadowing. Thus, these adapted parameters include an establishment of selected transmission elements based on a predetermined target distribution of the magnetization of the RF field or a target RF field emitted by the transmission elements. The homogeneity of the magnetization for selecting the transmission elements, an RF exposure value (e.g., a SAR value), a maximum power consumption, or a combination thereof, may be predetermined.

These requirements may be used to establish an actuation sequence for the MRI imaging system and may be taken into account in a corresponding optimization method for the actuation sequence. Currently inactive transmission elements may be detuned. The currently inactive transmission elements may be used for homogenizing the magnetic resonance RF field produced by the currently active transmission elements. The homogenizing may be achieved by "coupling" or resonance of the inactive transmission elements in the RF field. There may be an actuation of the selected transmission element or elements.

The disclosed embodiments contribute to an improved homogeneity of the RF field produced during a primary measurement of the patient target volume. The exposure of a patient to an RF field may be reduced, and the power consumption of a local coil system of the MRI imaging system may be reduced.

The focus of the optimization, e.g., when establishing the actuation sequence, may be predetermined differently by a user of the MRI imaging system, depending on specific criteria such as, e.g., a specific interest in relation to the findings.

For example, the field distribution or the magnetization of a RF field may be established in a pre-measurement or overview measurement using the power distributor. The power distributor may be connected for establishment purposes, such as in a basic setting with respect to amplitude and phase of a RF signal. The power distributor may be connected to a plurality of independent input channels or transmission channels. The transmission elements selected for an activation are established taking into account the connection options of the power distributor. In order to establish the field distribution, the independent transmission channels may be operated in a basic setting. Control data based on the actuation sequence may be transmitted simultaneously to a plurality of independent input or transmission channels (e.g., RF generators, power amplifiers, or both RF generators and power amplifiers) and to the power distributor. A corresponding optimization method for an actuation sequence may consider these connection options and provide suitable control data to effect a selection of transmission elements.

The transmission element may be connected independently of external limit values and in one of the above-described dependencies. The transmission element may be connected depending on previously defined RF exposure values.

For example, an RF exposure value may be an SAR limit value set by health authorities. A number of active transmission elements in a specific region of the local coil system may be limited due to the exposure value such that a sum of the transmission powers of the active transmission elements does not exceed the defined exposure or limit value. Transmission elements that would be active without consideration of the exposure value may then be inactive during a measurement. Alternatively, a transmission power of one or more transmission elements may be reduced or limited such that a sum of the transmission powers is not higher than the RF exposure value. The patient is thus protected from possible tissue damage due to exposure to excessive electromagnetic radiation.

According to one embodiment, a method includes determining a patient target volume of the patient, establishing a position of the patient target volume relative to a position of the object-bearing table in a pre-measurement of the patient, establishing a field distribution of a magnetic resonance RF field produced at least in the patient target volume in the pre-measurement by a number of transmission elements of the local coil system, positioning a target volume segment of the patient target volume in the measurement region based on the pre-measurement, selecting at least one transmission element disposed with respect to the target volume segment in accordance with a predetermined criterion, and actuating the selected transmission element or transmission elements for emitting a magnetic resonance RF field in the direction of the target volume segment lying in the measurement region. The transmission elements are actuated based on the field distribution established during the pre-measurement such that a current field distribution of the magnetic resonance RF field produced thereby corresponds with a predetermined target distribution, at least in the target volume segment.

For example, the patient target volume may be determined by an operator who wishes to implement an examination with a specific interest in relation to the findings. After the identification of the patient target volume, there may be localization thereof in the body of the patient, e.g., via segmentation of image data of the patient. The image data may be acquired in advance during a pre-measurement, for example, in the form of a topogram.

The position of the patient target volume may subsequently be encoded by establishing position coordinates relative to the reference system of the object-bearing table. In the event that the patient target volume has a constant position throughout the procedure of a pre-measurement and a primary measurement, the subsequent primary measurement may be implemented using the position coordinates established in the pre-measurement.

For example, the term "field distribution" means a B1 map that records the local field strengths of a RF field. The field distribution is established by reception elements of the local coil system. The reception elements receive magnetic resonance signals. Field distribution data may be calculated, e.g., in a measurement control unit of the magnetic resonance imaging system, based on the basis of the magnetic resonance signals.

The positioning of a target volume segment in the measurement region means that the object-bearing table with the patient placed thereon is displaced or moved to an extent relative to the main magnetic field apparatus until the entire target volume segment is disposed in the measurement region. The displacement occurs while comparing, in each case, current location data of the object-bearing table relative to the main magnetic field apparatus with the stored position coordinates of the patient target volume relative to the table.

An ideal position of a transmission element relative to the target volume segment may result in, for instance, a transmission element closest to the target volume segment is activated. The activated transmission element is one of a number of transmission elements. Such activation produces an RF field of the active transmission element primarily directed to the target volume segment. As a result, less tissue outside of the target volume segment is excited by the emitted RF field. Additionally, close positioning of the transmission element may allow a reduction in the transmission power compared to transmission elements situated further away.

An ideal position of a transmission element relative to the target volume segment may also result in, for instance, a transmission element with an RF field that impinges on the target volume segment in such a direction that enables an excitation of a particularly small tissue volume outside of the patient target volume. Therefore shadowing is reduced. Additionally or alternatively, the active transmission element or elements may be selected according to the criterion that the RF field impinges on tissue regions that, as a result of anatomical peculiarities, increase a probability of shadowing to the smallest possible extent.

The transmission elements active in the primary measurement of the patient target volume may be actuated such that the respective transmission power of each transmission element is set with respect to a largest possible homogeneity of the RF field. A defined target distribution of the RF field is thus obtained.

After a first primary measurement of a target volume segment, the above-described steps of positioning the target volume segment, selecting the transmission elements to be activated and actuating the transmission elements may be repeated until the patient target volume is detected according to a defined scanning protocol. For example, the scanning protocol may be designed for a complete detection of a patient target volume or for a partial detection such that, e.g., merely individual slice images of the patient target volume are provided, but the slice images do not image the whole volume of the patient. The positioning of the target volume segment or the displacement of the object-bearing table may occur, e.g., step-by-step or continuously. Specific transmission elements may be actuated in sequence in coordination with the positioning or displacement.

The above-described local coil system includes at least one adaptation unit for adapting an amplitude, a phase shift, or both an amplitude and a phase shift, of an electrical signal.

The adaptation unit may be arranged at any position in a power electronics apparatus to connect the local coil system. For example, an RF generator for producing a RF signal may have an adaptation unit. The RF generator is a component of the power electronics apparatus. Alternatively, for example, the adaptation unit or a plurality of adaptation units may be connected directly upstream of the transmission elements or be connected downstream of a power distributor of the power electronics apparatus. For example, a connector on the power distributor may have a securely installed adaptation unit. A local coil or a number of transmission elements has been inserted into the connector.

The adaptation unit may be embodied to receive control commands produced based on a preceding establishment of inhomogeneities of the RF field in the examination object. Depending on the control commands, one or more adaptation units (e.g., for each transmission element) may vary an amplitude, a phase shift, or both an amplitude and a phase shift, individually. Therefore, inhomogeneities in the RF field may be avoided or reduced.

In principle, the transmission elements may additionally be configured to receive magnetic resonance signals. According to one embodiment, the local coil system includes separate reception elements for receiving a magnetic resonance signal.

The "separate reception elements" mean that the reception elements and the transmission elements are configured functionally and spatially separated from one another. The reception elements may be disposed as close to a patient or a patient target volume as possible during a measurement. To this end, the reception elements may be housed in, e.g., a flexible carrier that adapts to the body surface and is disposed on the patient during the measurement. In the case of an appropriate spatial grouping of the object-bearing table, the reception elements also may be arranged, e.g., in a layer that, from the perspective of a body, is disposed in front of a separate layer of transmission elements. The reception elements may receive magnetic resonance signals and, e.g., process the magnetic resonance signals further into electrical signals. The magnetic resonance signals may subsequently be forwarded to an image reconstruction unit, which calculates image data therefrom. The separate reception elements positioned as close to the patient target volume as possible during the measurement may achieve a useful signal-to-noise ratio (SNR).

The magnetic resonance imaging system may additionally include the following components for implementing the method: a position detection unit to detect a position of the patient target volume relative to a location of the object-bearing table; a field distribution establishment unit to establish a field distribution of a magnetic resonance RF field produced by a number of transmission elements of the local coil system in the patient; a positioning unit to position a target volume segment of the patient target volume in the measurement region; a selection unit to select at least one transmission element; and, a control system to actuate the selected transmission element or transmission elements that emit a magnetic resonance RF field in the direction of the target volume segment disposed in the measurement region.

A majority of the components of the magnetic resonance imaging system, such as the position detection unit, the field distribution establishment unit, and the selection unit, may also be configured as software modules. For example, the software modules may be modules on a control system of an MRI system. A largely software-based implementation of the method is useful in that already existing magnetic resonance imaging systems may be retrofitted by a software update in order to operate according to the disclosed embodiments. In this respect, the object is also achieved by a computer program product, which may be loaded directly into a memory (or other non-transitory computer-readable storage medium) of a programmable control system of a magnetic resonance imaging system. The computer program product includes program code for executing all steps of the method of the disclosed embodiments if the computer program product is executed on the control system.

DETAILED DESCRIPTION

Figure 1:
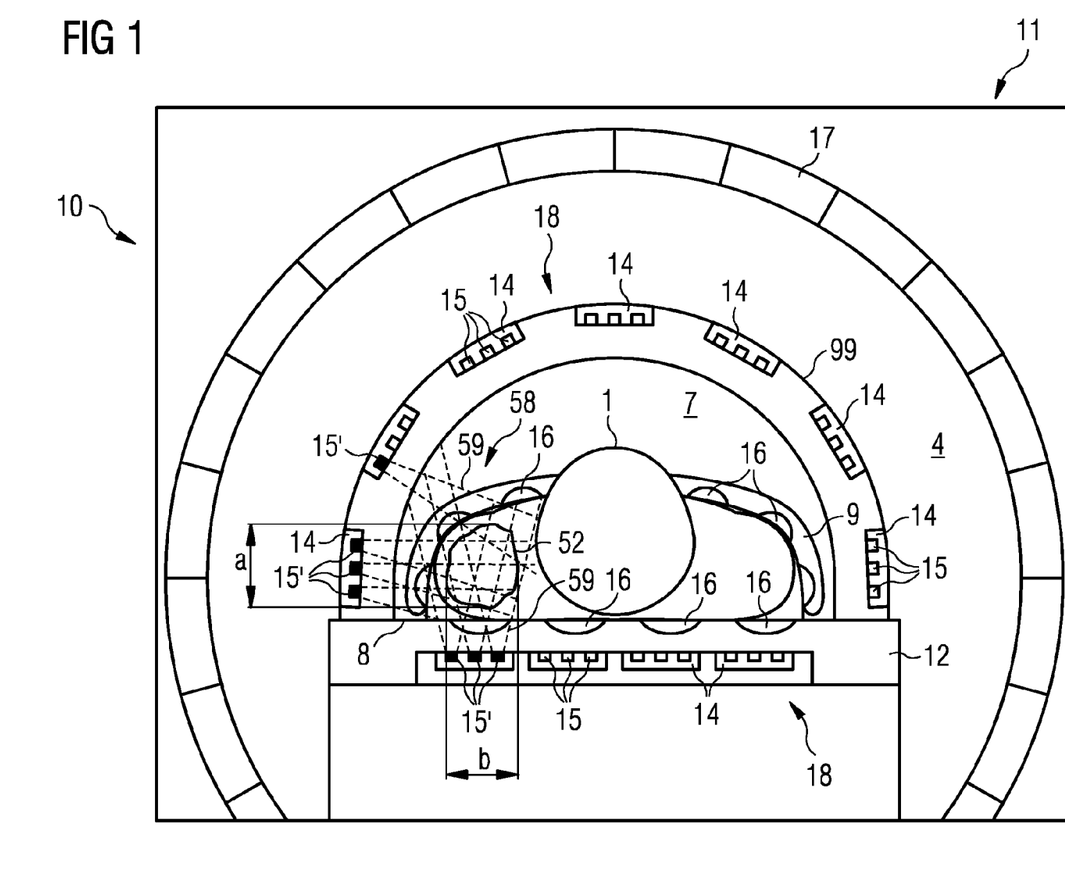
FIG. 1 shows a cross section through an object-bearing table of a magnetic resonance imaging system, during a magnetic resonance recording of a patient in a first position, the magnetic resonance imaging system having a local coil system according to one embodiment.

FIG. 1 shows a magnetic resonance imaging system 10 with a housing 11 and an object-bearing table 12. The object-bearing table 12 may be displaced relative to the housing 11. The housing 11 includes a main magnetic field apparatus 17 and a patient tunnel or magnetic resonance measurement space 4 with a round cross section. The object-bearing table 12 includes a local coil system 18, a couch 8 for a patient 1 to be placed on, and an arc-shaped cover 99 over the couch 8 for covering a patient 1 positioned on the couch 8. A cavity 7 between the couch 8 and the cover 99 is configured to accept the patient 1. Together, the local coil system 18 and the main magnetic field apparatus 17 form a scanner unit of the magnetic resonance imaging system 10.

The local coil system 18 is housed in the couch 8 and the cover 99. The local coil system 18 has a plurality of local coils 14. The plurality of local coils 14 are distributed over an extent of the couch 8 and of the cover 99. The local coils 14 surround a patient 1 positioned on the couch 8 to the extent that the cover 99 exposes openings for a head region of the patient 1. Each local coil 14 contains a plurality of transmission elements 15 for emitting a magnetic resonance RF field. A plurality of reception units 16 for receiving magnetic resonance signals are grouped analogously to the local coils 14 in the couch 8 around the cavity 7. The plurality of reception units 16 may be included in the cover 99 as an alternative to the embodiment shown. Image data of the patient 1 may be produced based on the magnetic resonance signals. The reception elements 16 are seated closer to the cavity 7 than the transmission elements 15. Additionally, the local coil system 18 has a ceiling 9 with a plurality of reception elements 16.

In the patient tunnel 4, the main magnetic field apparatus 17 produces a main magnetic field (not depicted). A measurement of the patient always occurs in the region of a homogeneity volume (see FIG. 2) of the main magnetic field. For example, the homogeneity volume is a spherical space in which the main magnetic field is distributed homogeneously. A measurement of a patient target volume 52 of the patient 1, in this case a shoulder region, is achieved via a selected number of transmission elements 15' of the local coil system 18. The number of activated transmission elements 15' depends on a position of the patient target volume 52 relative to the local coil system 18 and, thus, relative to the couch 8 and the cover 99. The number of activated transmission elements 15' moreover depends on a height extent a and a transverse extent b of the patient target volume 52 in the measurement region (see FIG. 2).

FIG. 1 shows seven active transmission elements 15', each of which is disposed directly adjacent to the patient target volume 52. As a result, the transmission elements 15' of two local coils 14 are completely activated. By contrast, only one transmission element 15' of a third local coil 14 is switched on. Each active transmission elements 15' emits magnetic resonance RF fields 59, which are directed to a certain extent in the direction of the patient target volume 52. The RF fields 59 are superposed on one another such that a predetermined, homogeneous magnetic resonance RF field 58 is produced in the region of the patient target volume 52 for producing a given target magnetization. The reception elements 16 measure a precessing magnetization of the patient target volume 52. Corresponding signals are processed to form slice image data of the patient target volume 52 in subsequent steps. In addition to activating or deactivating the transmission elements 15', 15, an intensity (amplitude) of the magnetic resonance RF fields emitted from each individual transmission element 15' may be varied. For example, the intensity may be varied based on a condition of the tissue of the patient 1 or on previously defined limit values of a "specific absorption rate" of the electromagnetic radiation. Moreover, a phase shift of electrical signals with respect to one another may be adjusted for each transmission element 15, 15'. The electrical signals form a magnetic resonance RF field.

Figure 2:
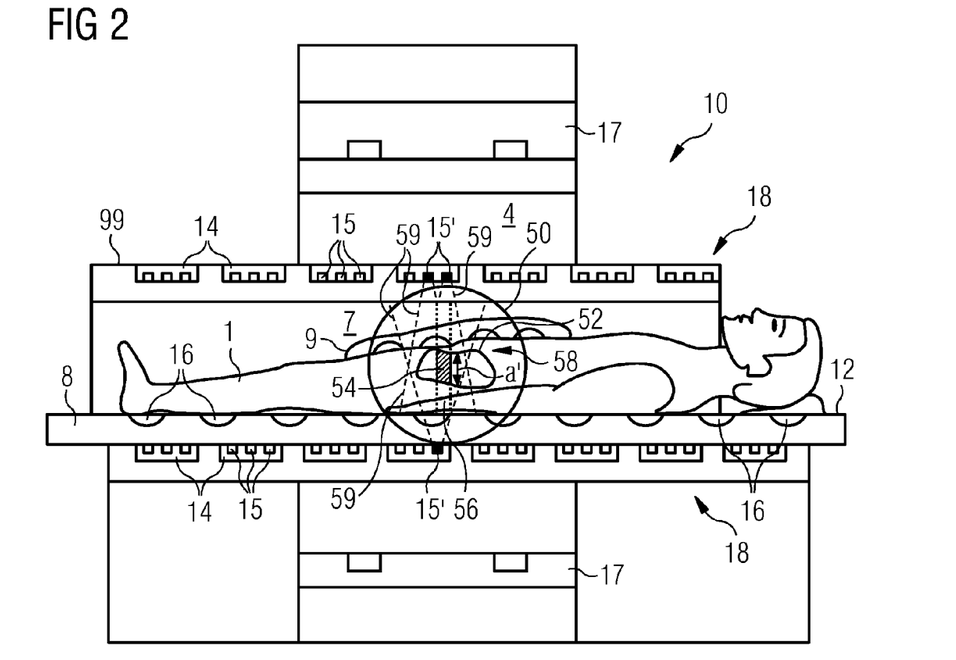
FIG. 2 shows a longitudinal section through the object-bearing table of FIG. 1 during a magnetic resonance recording of a patient in a second position.

FIG. 2 shows a section through the magnetic resonance imaging system 10, rotated by substantially 90° as depicted in FIG. 1. The local coils 14 with the transmission elements 15 and the reception elements 16 are largely distributed over the entire longitudinal extent of the couch 8 and of the cover 99 or the ceiling 9. The cover 99 has a shorter embodiment than the couch 8 and merely covers the legs and the torso of the patient 1 and leaves the head region exposed. In contrast to FIG. 1, in this case, a lower abdomen region of the patient 1 forms the patient target volume 52. Slice image data of the patient target volume 52 is produced. The largely spherical homogeneity volume 50 of the main magnetic field intersects with the cavity 7. The volume 50 extends from the bearing face of the couch 8 to an inner vertex face of the cover 99. In the region of the homogeneity volume 50, there is a disk-shaped measurement region 56, which likewise extends from the bearing face of the couch 8 to an inner vertex face of the cover 99. Therefore, the volume 50 has an extent that supports a measurement of any body part of the patient 1. For example, the measurement region 56 has a thickness of 10 cm along a longitudinal extent of the couch 8. In the case of a single measurement, a homogeneous magnetic resonance RF field is produced in the region of a target volume segment 54. The target volume segment 54 is an intersection between the patient target volume 52 and the measurement region 56. A height extent a' and a transverse extent (not depicted) of the target volume segment 54 determine a selection of the transmission elements 15 that are activated for emitting a magnetic resonance RF field.

The reception elements 16 may also be employed as transmission elements 15. In this case, the activation or selection of the transmission elements 15' may also include reception elements 16, which then are to be operated as transmission elements 15 and are arranged in, e.g., the cover 99, the ceiling 9 or the couch 8. The selection may implemented such that, in each case, only individual transmission elements 15' or groups of transmission elements 15' are activated. A fewer number of transmission elements of a local coil 14 than the total number of transmission elements 15 of the local coil 14, for example, of the ceiling 9, may thus be selected or activated. If the local coil 14 is configured as an independent component, the local coil 14 may be referred to as local coil unit.

Figure 3:
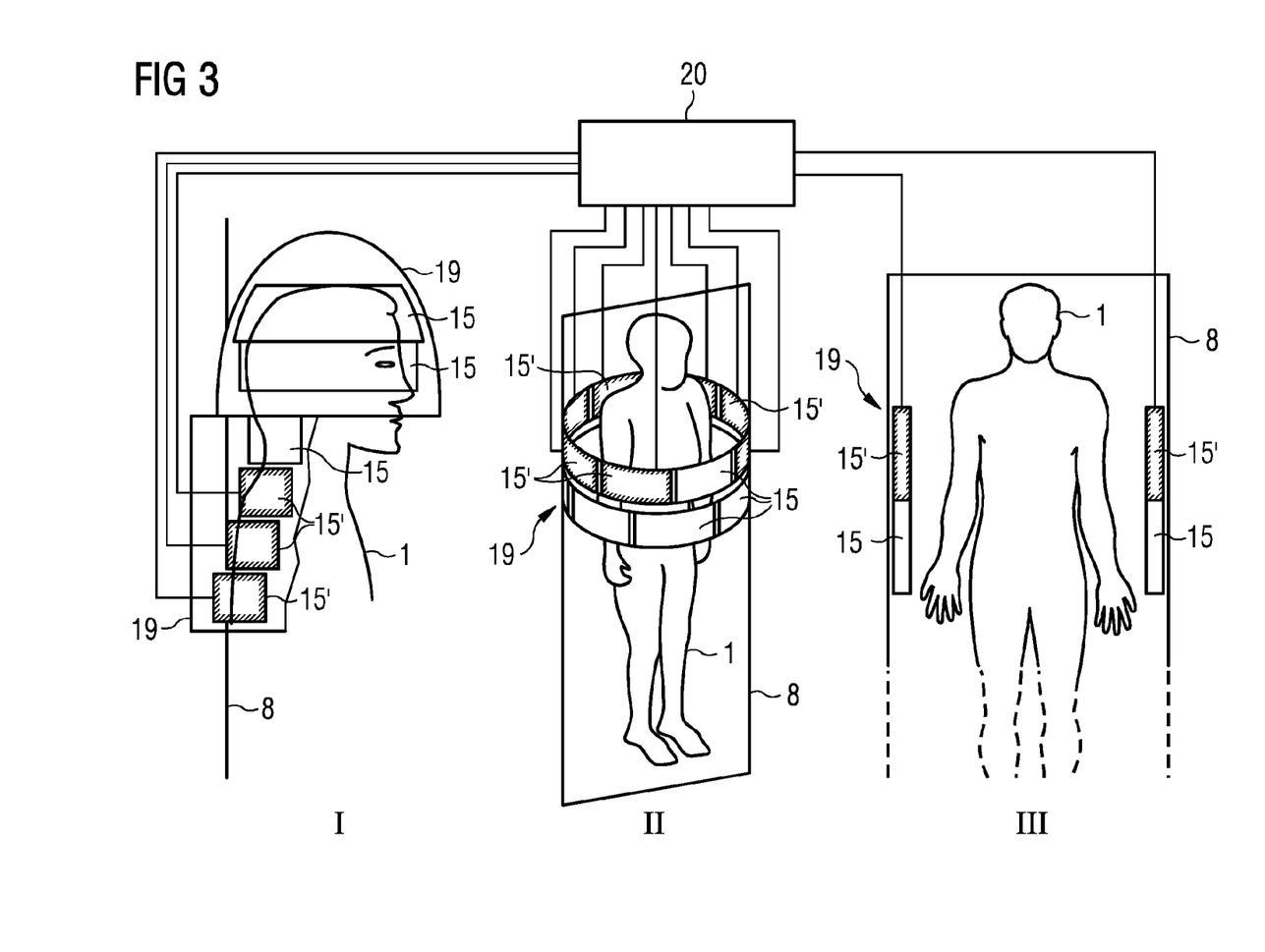
FIG. 3 shows three partial views of a patient surrounded by a plurality of local coil units in accordance with one embodiment.

FIG. 3 shows a plurality of views of a patient 1. A plurality of local coil units 19 are arranged around the patient 1. The plurality of local coil units 19 is arranged on the patient or in the vicinity of the patient before the start of a magnetic resonance measurement in order to enable an interruption-free (e.g., fast) examination of the patient. In a partial view I, a head coil surrounds the head of the patient 1 like a helmet, and a cervical vertebral column coil surrounds a cervical vertebral column of the patient 1 in the shape of a half-shell. The head coil and the column coil are depicted as local coil units 19. The patient 1 is also surrounded by a thorax coil, as shown in view II. The thorax coil surrounds an upper body or breast region of the patient in a ring or cylinder-type form. Partial view III forms a top view on the patient 1 placed on the couch 8, in accordance with view II. Each local coil unit 19 has a plurality of transmission elements 15, 15'. In accordance with the embodiment of FIG. 3, transmission elements 15' are connected automatically to effect ideal imaging of the cervical vertebral column adjoining the upper chest region of the patient 1. The active transmission elements 15' belong to different local coil units 19. Three transmission elements 15', which are components of the cervical vertebral column coil (partial view I), and seven transmission elements 15', which are components of the thorax coil (partial view II), are selected to produce an image. The total number of transmission elements 15 of the respective local coil units 19 may thus be greater than the number of activated or selected transmission elements 15'.

Selection and supply of transmission power to the active transmission elements 15' is achieved via a power distributor 20. The power distributor 20 is described in more detail in FIGS. 4-6.

The local coil units 19 may be local coils 14 that have different forms of transmission elements 15, 15'. For example, the local coils 14 have different loop sizes. Each transmission element 15, 15' may be actuated individually. The transmission elements 15' are configured such that the transmission elements 15' substantially follow an anatomical form of the human patient 1. The transmission elements 15' are embedded in carriers or local coil units 19, which are configured, e.g., as cylindrical coils, as half shells or partial shells, or as coil mats.

For example, the shoulder or pelvis or prostate coils are half shells. For example, the head, thorax, arm, hand and leg coils are cylindrical coils. For example, the spine coil may be a coil mat. The spine coil may be configured as an uneven number of coil rows, or rows of transmission elements 15, 15' along the vertebral column of the patient 1. The cylindrical coil elements completely cover a body part of the patient 1, whereas the half shells only offer a restricted angular cover.

However, further specialized local coil units 19 may be used, such as a cardiac coil with an upper and lower part. The transmission elements 15, 15' of the cardiac coil may be similarly arranged and configured in a regular manner. However, the transmission elements 15, 15' may be adapted further to the anatomical form of the body 1 and have different loop sizes.

A further variant of a specialized local coil unit 19 may be a breast coil for capturing images of a female breast. The breast coil includes one or more transmission element rings in an arrangement tapering towards the tip of the breast. Each transmission element ring completely surrounds a circumferential line of the breast and has a plurality of individually actuatable transmission elements 15, 15'. The transmission element rings may be embedded or included in one or two bearing pots, which anatomically follow the female breast.

An analogous arrangement of transmission element rings may be used for, e.g., each of the cylindrical local coil units 19 depicted in FIG. 3, partial view II.

Each half shell-shaped local coil unit 19 has circular segments corresponding with the angular cover thereof instead of the transmission element rings. Each of the circular segments, in turn, may include a plurality of transmission elements 15, 15'.

A predetermined distance of the transmission elements may be achieved by, e.g., fitting mounts on the object-bearing table 12 or may already be predetermined by the local coil units 19.

Figure 4:
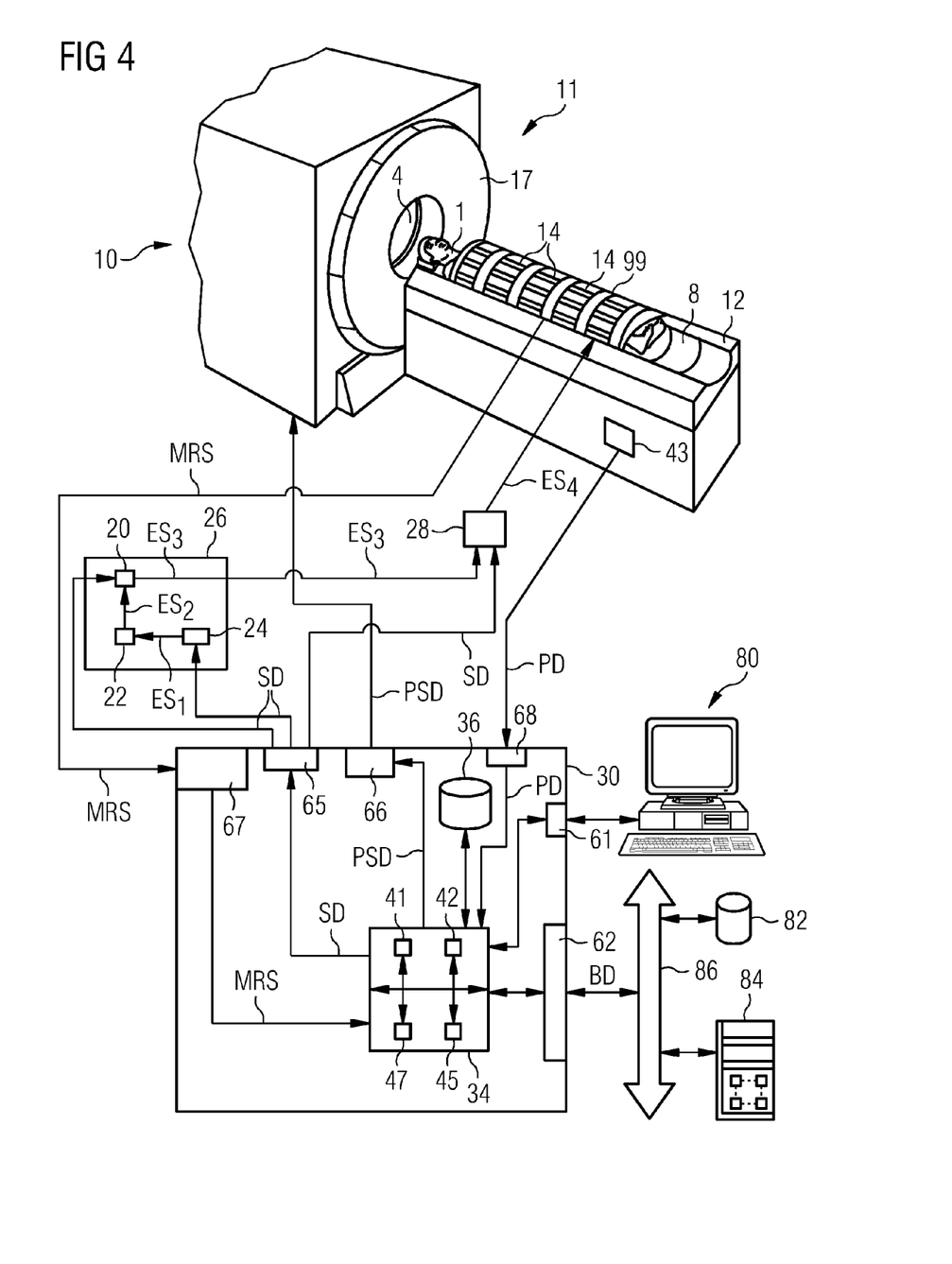
FIG. 4 is a schematic illustration of a magnetic resonance imaging system according to one embodiment.

FIG. 4 shows the magnetic resonance imaging system (MRI system) 10 with an object-bearing table 12 displaceable relative to the housing 11. Components of the MRI system 10 include a control system 30 for controlling the MRI system 10 and a power electronics apparatus 26 as a switching apparatus of the local coil system 18 arranged on the object-bearing table 12.

The control system 30 controls or connects the power electronics apparatus 26 and the local coil system 18. The control system 30 also controls or connects the adaptation unit 28 and the object-bearing table 12.

The control system 30 includes a measurement control unit 34 as a control apparatus, a scanning protocol memory 36, from which a stored scanning protocol may be retrieved, and a number of input and output interfaces 61, 62, 65, 66, 67, 68. A terminal interface 61, which is configured as an input and output interface, connects the measurement control unit 34 to a terminal 80 or a computer system. Selection and control information may be input and output by an operator interacting with the terminal interface 61. A bus interface 62 is also configured as an input and output interface. The bus interface 62 connects the measurement control unit 34 to a bus 86 for data transfer. The bus 86, in turn, is connected to a medical information and imaging system 84 and a mass storage medium 82.

The measurement control unit 34 includes a position detection unit 42. The position detection unit 42 processes location data PD indicative of a current position of the object-bearing table 12 relative to the fixedly installed main magnetic field apparatus 17. The location data PD is detected by a location establishment unit 43 installed on the object-bearing table 12 and forwarded to the control system 30 via the input interface 68. The position detection unit 42 processes the location data PD using the magnetic resonance signals MRS in position coordinate data LKD.

The measurement control unit 34 includes a field distribution establishment unit 45. The field distribution establishment unit 45 processes magnetic resonance signals MRS that are detected by the reception elements 16 (FIGS. 1 and 2) of the local coils 14 and supplied to the control system 30 via the input interface 67 in field distribution data FVD. The field distribution data FVD contain information relating to a field distribution of a magnetic resonance RF field 58 produced by the transmission elements 15, 15' (FIGS. 1-3) and therefore indicative of a degree of the homogeneity of the magnetic resonance RF field 58. The field distribution establishment unit 45 may forward the field distribution data FVD to a scanning protocol establishment unit (not shown) that may be a component of the control system 30 or the measurement control unit 34. The scanning protocol establishment unit may be implemented externally. The measurement control unit 34 may be configured to select the active transmission elements 15' based on predetermined criteria, such as an SAR limit value, a specific magnetization target distribution of the RF field 58, or a maximum power consumption of the local coil system 14. Criteria, such as the current location of the object-bearing table 12, the extent of the patient target volume 52 in the measurement region 56, and a specific interest in relation to the findings, may be considered in the selection. For example, the measurement control unit 34 may be connected to a scanning protocol establishment unit (not shown) or include a scanning protocol establishment unit. The aforementioned criteria and parameters may then be considered when establishing an actuation sequence. The measurement control unit 34 then produces suitable control data SD or location control data PSD.

The measurement control unit 34 includes an actuation unit 41 for actuating the power electronics apparatus 26 based on the location data PD, the field distribution data FVD and the position coordinate data LKD. The actuation unit 41 may be a component of the scanning protocol establishment unit (not shown). To this end, the actuation unit 41 generates location control data PSD. The location control data PSD is transmitted to the MRI system 10 via the output interface 66. The location control data PSD defines target coordinates of a displacement of the object-bearing table 12. The actuation unit 41 moreover produces control data SD. The control data SD is transmitted to the power electronics apparatus 26 via the output interface 65.

The measurement control unit 34 includes an image reconstruction unit 47. The image reconstruction unit 47 may produce image data BD of a patient 1 or a patient target volume 52 from magnetic resonance signals MRS or electrical signals produced from the magnetic resonance signals MRS.

The power electronics apparatus 26 includes an RF generator 24, an RF power amplifier 22, and a power distributor 20. The RF generator 24 produces RF signals $ES_1$. The RF power amplifier 22 follows in the signal path to amplify the RF signals $ES_1$ to form amplified electrical signals $ES_2$. The power distributor 20 splits or combines the amplified RF signals $ES_2$ to form signals $ES_3$, which may be partial signals, mixed signals, or both partial signals and mixed signals. Connected downstream of the power distributor 20 is an adaptation unit 28, via which an amplitude and a phase shift of the RF signals $ES_3$ may be set. Based on the field distribution data FVD, the actuation unit 41 actuates the adaptation unit 28 with control data SD for adapting the RF signals $ES_3$. The adaptation unit 28 produces optimized electrical signals $ES_4$. The optimized signals $ES_4$ flow to selected local coils 14 or to selected transmission elements 15' of the local coils 14.

For example, image data BD, image processing commands, and other information to be supplied to further image data users for post-processing, storage or forwarding, may be forwarded via the bus interface 62. The information includes all data calculated by the measurement control unit 34 or by one of the subunits of the measurement control unit 34, such as control data SD, location control data PSD, field distribution data FVD, position coordinate data LKD and image data BD. Therefore, the medical information and imaging system 84 may implement (partial) functions of the position detection unit 42, the location establishment unit 43, the field distribution establishment unit 45 and the image reconstruction unit 47. For example, the medical information and imaging system 84 may implement a segmentation method that includes the localization of the patient target volume 52 and is useful for establishing an extent or dimension of the patient target volume 52 in the body of the patient 1. In different intermediate acts of the method according to one embodiment, data records may be buffer stored in the mass storage medium 82 and then returned to the processing chain by a data processing unit.

Figure 5:
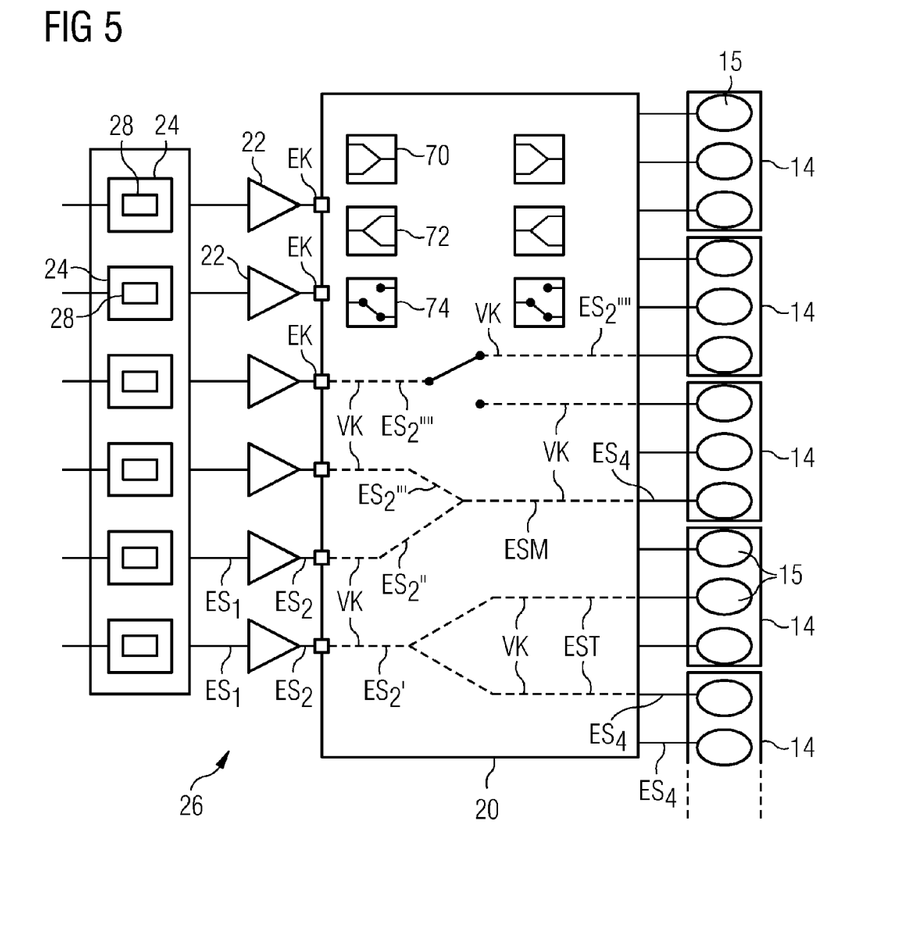
FIG. 5 is a schematic illustration of one embodiment of a power electronics apparatus of the magnetic resonance imaging system.

FIG. 5 shows a power electronics apparatus 26 coupled to a local coil system 18. The power electronics apparatus 26 is similar to the power electronics apparatus 26 shown in FIG. 3. In contrast to the apparatus in FIG. 3, an adaptation unit 28 for modifying an amplitude and a phase shift of RF signals is a component of a RF generator 24 for producing RF signals. Based on control data SD, the RF generator 24 produces RF electrical signals $ES_1$ from supplied electrical current (not shown). The electrical signals $ES_1$ flow to a downstream RF power amplifier 22 that converts the signals $ES_1$ to amplified RF signals $ES_2$. The signals $ES_2$ are forwarded to a power distributor 20. The power distributor 20 once again processes the signals $ES_2$. Selected local coils 14 or selected transmission elements 15 are then actuated by electrical signals $ES_4$.

The power distributor 20 is configured such that the power distributor 20 may combine (a "combiner" function) two or more incoming electrical signals $ES_2$ to form electrical mixed signals ESM and split (a "splitter" function) a signal $ES_2$ into two or more partial signals EST. Moreover, when forwarding an electrical signal $ES_2$, a mixed signal ESM or a partial signal EST, the power distributor 20 may switch between two or more distributor channels VK (a "multiplexer" function).

In the embodiment shown in FIG. 5, a signal $ES_{2'}$ is divided into two partial signals EST, which flow to different transmission elements 15 disposed in different local coils 14. A signal $ES_{2''}$ and a signal $ES_{2'''}$ flow into the power distributor 20 from different RF power amplifiers 22. The signal $ES_{2''}$ and a signal $ES_{2'''}$ are combined to form a mixed signal ESM, which is forwarded to a single transmission element 15. In another case, the power distributor 20 connects one of two distributor channels VK such that a signal $ES_{2'}$ entering the power distributor 20 flows on unchanged to a transmission element 15 disposed downstream of the power distributor 20.

Signal processing by the power distributor 20 may be a cascade of combining, distributing or switching in any sequence and with any selection. For example, electrical signals that are fed into the power distributor 20 from any number of input channels may be combined in the power distributor 20 such that the electrical signals are focused on a single transmission element 15 in one local coil 14. The power distributor 20 thus enables completely flexible guidance of RF signals to arbitrary transmission elements 15.

Figure 6:
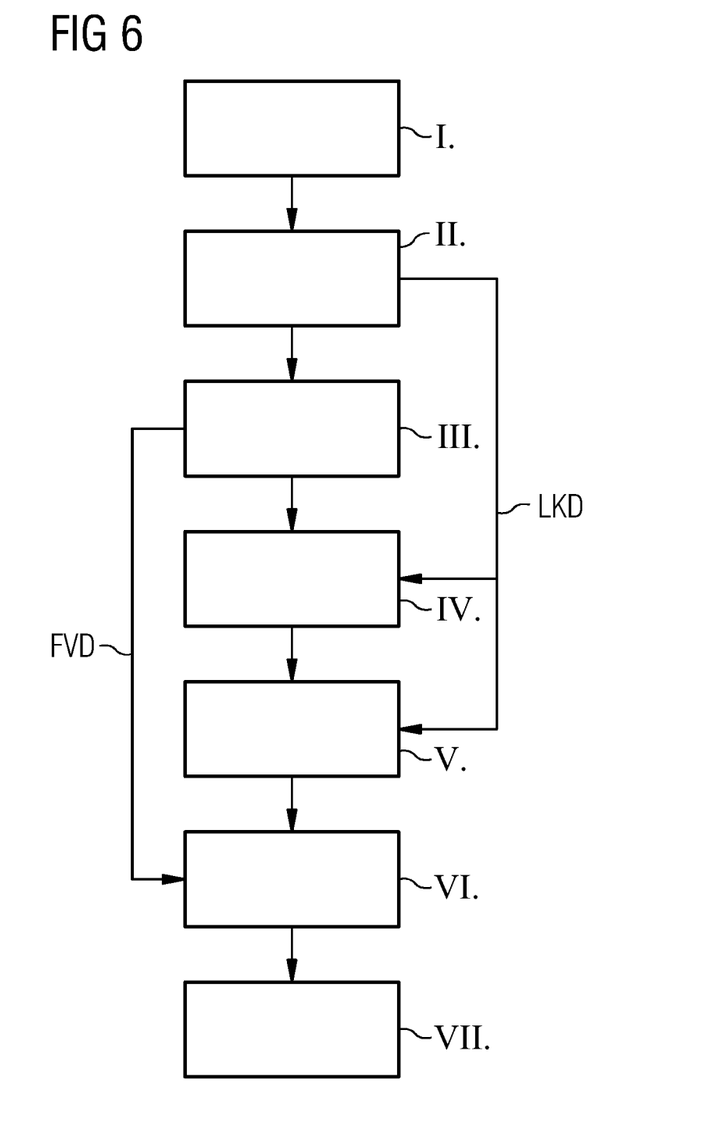
FIG. 6 is a flowchart of a procedure of a method for producing a magnetic resonance RF field according to one embodiment.

FIG. 6 shows a sequence of a selective production of a local magnetic resonance RF field 58 from superposed RF fields 59 of the active transmission elements 15' in a magnetic resonance imaging system 10 according to FIG. 3.

In an act (I) of the method, a patient target volume 52 of a patient 1 to be examined with a specific interest in relation to the findings is set. For example, the patient target volume 52 to be examined may be an organ of a human or animal, e.g., a brain, a kidney or a heart.

In an act (II), the patient 1 is placed on a couch 8 of an object-bearing table 12 of the MRI system 10 within the scope of a pre-measurement. The act II includes establishing a current position of the patient target volume 52 relative to the main magnetic field apparatus 17 of the magnetic resonance imaging system 10 (see FIG. 3).

To this end, the current position of the patient target volume 52 relative to the object-bearing table 12 or relative to a couch 8 and a cover 99 is established. A comparison is implemented simultaneously with respect to the current position of the object-bearing table 12 relative to the main magnetic field apparatus 17.

Produced during the pre-measurement are magnetic resonance signals MRS of the patient 1, or of a region of the patient 1, in which the patient target volume 52 is disposed. The magnetic resonance signals MRS are processed in the image reconstruction unit 47 of the control system 30 to form image data BD. The position of the patient target volume 52 may be established, e.g., by segmentation, from the image BD. The image data BD includes three-dimensional position coordinates of the patient target volume 52 and information relating to a relief or a topography of the patient target volume 52 and about the volume and the extent thereof in the body of the patient 1. The image data BD of the patient target volume 52 is linked to the reference system of the object-bearing table 12 or the couch 8 and the cover 99.

At the same time, a reference is established with the current position of the object-bearing table 12 relative to the fixedly installed main magnetic field apparatus 17. The current position is encoded by location data PD. The location data PD is processed in a position detection unit 42 of the control system 30 of the MRI system 10 to form position coordinate data LKD. Using the position coordinate data LKD, the object-bearing table 12 may be precisely displaced during a subsequent primary (or secondary) measurement into a location that places the patient target volume 52 or a target volume segment 54 in a measurement region 56.

In an act (III) or in a partial act of the pre-measurement, a field distribution of a magnetic resonance RF field 58 is established. The magnetic resonance RF field 58 is produced in the patient 1 by individual transmission elements 15 of the local coil system 18. The establishment of the field distribution is achieved by virtue of the fact that, based on the magnetic resonance signals MRS obtained during the pre-measurement, field distribution data FVD or a so-called "B1 map" is calculated in a field distribution establishment unit 45 of the control system 30. Magnetic resonance RF pulses are successively emitted in the direction of the patient 1 by individual transmission elements 15 and magnetic resonance signals MRS are received by reception elements 16. This partial act optimizes the homogeneity of the magnetic resonance RF field 58.

In an act (IV), the target volume segment 54 of the patient target volume 52 is positioned in the measurement region 56. The position coordinate data LKD, established in step II, is used to move the object-bearing table 12 with the patient 1 situated on the couch 8 into a suitable location relative to the main magnetic field apparatus 17 or to the homogeneity volume 50 so that a first target volume segment 54 lies in the measurement region 56. Location control data PSD to this end is calculated by the actuation unit 41 of the control system 30 based on the position coordinate data LKD produced in advance. The location control data contains the coordinates of a target location, to which the object-bearing table 12 or the patient table has to be displaced for the start of a measurement of the first target volume segment 54.

In an act (V), specific transmission elements 15 of the local coil system 18 are selected for activation during a subsequent primary (or secondary) measurement based on the position coordinate data LKD produced in the pre-measurement (II). In addition to the position coordinate data LKD, information about so-called "shadowing" is included in the selection of the transmission elements 15. The information may be extracted from the previously obtained field distribution data FVD. The undesired shadows, e.g., reduced field intensities, are generated depending on a position of each transmission element 15 relative to a target volume segment 54 and depending on a condition of the tissue around and within the target volume segment 54. The shadows lead to darkening at the corresponding positions of the slice image. Therefore, a change in the selection of the transmission elements 15 based on the information may avoid or reduce shadowing. Additionally, the selection is compared to previously defined specific absorption rate values (SAR values), which may depend on standards set by health authorities. If activation of a large number of transmission elements 15 in a specific sector of the local coil system 18 threatens to exceed a critical SAR value in the patient 1, the number of active transmission elements 15' is limited accordingly. For example, this selection may be implemented by the scanning protocol establishment unit.

In an act (VI), the transmission elements 15' selected in the act V for activation are actuated. RF fields 59 are emitted by the individual transmission coils 15' and are superposed to form the magnetic resonance RF field 58. Parameters of the RF fields 59 are optimized using the field distribution data FVD ("B1 map") obtained in the act III. The parameters are optimized to achieve a homogeneous field distribution in at least the target volume segment 54. The processes of actuation and, thus, optimization are implemented via the actuation unit 41 of the control system 30 emitting control data SD to a power electronics apparatus 26 of the MRI system 10. The power electronics apparatus 26 produces electrical signals $ES_3$ based on the control data SD. The power electronics apparatus 26 excites the active transmission elements 15' either to emit the RF fields 59 or to produce the magnetic resonance RF field 58 via the adaptation unit 28. The adaptation unit 28 adapts the electrical signals $ES_3$ to form electrical signals $ES_4$.

In an act (VII), a primary measurement of the patient target volume 52 is implemented. During the measurement of a target volume segment 54 in the measurement region 56, the reception elements 16 in turn receive specific magnetic resonance signals MRS or measurement data. The signals MRS or data are forwarded to the image reconstruction unit 47 for calculating a slice image of the target volume segment 54.

The acts IV to VII are repeated until a desired magnetic resonance imaging examination of the patient target volume 54 is completed. Depending on the setting of a layer thickness of the measurement region 56, the object-bearing table 12 is displaced step-by-step, e.g., after every measurement, by the respective layer thickness until an extent of the patient target volume 54 along the couch 8 or the cover 99 is detected in the total number of measurement processes. In each individual partial measurement, implemented in stages, a selection of the transmission elements 15 to be activated (according to acts V and VI) is newly implemented in each case. As a result, specific transmission elements 15 are actively actuated and actuated for emitting an RF field with individual properties (intensity, phase shift, amplitude) during each partial measurement. The specific transmission elements together lead to an ideal image display of the respective target volume segment 54, while having the lowest possible exposure of the patient 1 to electromagnetic radiation. The disclosed embodiments may thus decrease energy consumption of the magnetic resonance imaging system, because a linear increase in the magnetic field strength is accompanied by a quadratic increase in the transmission power and, thus, the energy consumption of a conventional body coil system.

The above-described method may be implemented via a computer program product including one or more non-transitory computer-readable storage media having stored thereon instructions executable by one or more processors of a computing system. The computing system may be configured as a programmable control apparatus, an image production unit, or both. Execution of the instructions causes the computing system to perform operations corresponding with the acts of the method described above.

The devices described in detail above are merely exemplary embodiments, which can be modified by a person skilled in the art in various ways without departing from the scope of the invention. Furthermore, the use of the indefinite article "a" or "an" does not preclude the possibility of the relevant features also being present a number of times. Likewise, the term "unit" does not preclude this consisting of a plurality of interacting sub-components, which, if need be, can also be distributed in space.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for producing a magnetic resonance RF field in a magnetic resonance imaging system, the magnetic resonance imaging system comprising a main magnetic field apparatus and an object-bearing table, wherein the object-bearing table is movable relative to the main magnetic field apparatus and wherein a local coil system is arranged on, in, or on and in the object-bearing table, the local coil system comprising a plurality of local coils and a plurality of transmission elements, each local coil of the plurality of local coils including a portion of transmission elements of the plurality of transmission elements, wherein the transmission elements are configured to transmit the magnetic resonance RF field, the method comprising:

establishing a current location of the object-bearing table relative to the main magnetic field apparatus; and automatically activating a set of transmission elements of the plurality of transmission elements based on the current location of the object-bearing table and a size of a patient target volume segment of a patient target volume in a measurement region at the current location of the object-bearing table, the patient target volume segment being an intersection between the patient target volume and the measurement region, the size of the patient target volume segment comprising a height extent and a transverse extent, wherein the height extent is a distance in a vertical direction relative to the object-bearing table and the transverse extent is a distance in a horizontal direction perpendicular to the height extent in a plane parallel to the object-bearing table.

2. The method of claim 1, wherein each activated transmission element of the set of transmission elements is a component of a different local coil of the plurality of local coils.

3. The method of claim 1, wherein automatically activating a set of transmission elements comprises activating individual transmission elements of the respective portion of transmission elements based on a position of a defined region of the object-bearing table relative to the measurement region, and wherein a position of the measurement region is constant relative to the main magnetic field apparatus.

4. The method of claim 3, wherein automatically activating a set of transmission elements comprises activating at least one transmission element of the plurality of transmission elements depending on a position relative to the target volume segment of the patient target volume of a patient in the measurement region.

5. The method of claim 4, wherein automatically activating a set of transmission elements comprises connecting the at least one transmission element depending on the height extent or the transverse extent of the patient target volume in the measurement region.

6. The method of claim 4, wherein automatically activating a set of transmission elements comprises connecting the at least one transmission element depending on a pre-measurement of the patient.

7. The method of claim 4, wherein automatically activating a set of transmission elements comprises connecting the at least one transmission element depending on previously defined RF exposure values.

8. The method of claim 4, further comprising:
determining the patient target volume of the patient;
establishing a position of the patient target volume relative to a position of the object-bearing table in a pre-measurement of the patient;
establishing a field distribution of a magnetic resonance RF field produced at least in the patient target volume in the pre-measurement by a number of transmission elements of the local coil system;
positioning the target volume segment of the patient target volume in the measurement region based on the pre-measurement;
selecting at least one transmission element of the plurality of transmission elements disposed with respect to the target volume segment in accordance with a predetermined criterion; and
actuating the at least one transmission element to emit the magnetic resonance RF field in the direction of the target volume segment disposed in the measurement region,
wherein the at least one transmission element is actuated based on the field distribution established during the pre-measurement such that a current field distribution of the magnetic resonance RF field produced by the at least one transmission element corresponds with a predetermined target distribution in the target volume segment.

9. A magnetic resonance imaging system comprising a main magnetic field apparatus;
an object-bearing table movable relative to the main magnetic field apparatus;
a local coil system arranged on, in, or on and in the object-bearing table, the local coil system comprising a plurality of local coils, each local coil of the plurality of local coils including transmission elements to produce a magnetic resonance RF field;
a location establishment unit to establish a current location of the object-bearing table relative to the main magnetic field apparatus; and
a switching apparatus connected to the location establishment unit and configured to connect a set of the transmission elements based on the current location of the object-bearing table and a size of a patient target volume segment of a patient target volume in a measurement region at the current location of the object-bearing table, the patient target volume segment being an intersection between the patient target volume and the measurement region, the size of the patient target volume segment comprising a height extent and a transverse extent, wherein the height extent is a distance in a vertical direction relative to the object-bearing table and the transverse extent is a distance in a horizontal direction perpendicular to the height extent in a plane parallel to the object-bearing table.

10. The magnetic resonance imaging system of claim 9, further comprising:
a position detection unit to detect a position of the patient target volume relative to a location of the object-bearing table;
a field distribution establishment unit to establish a field distribution of a magnetic resonance RF field produced by a number of transmission elements of the local coil system in the patient;
a positioning unit to position the target volume segment of the patient target volume in the measurement region;
a selection unit to select at least one transmission element of the transmission elements; and
a control system to actuate the at least one transmission element to emit a magnetic resonance RF field in the direction of the target volume segment disposed in the measurement region.

11. A computer program product to implement a method of producing a magnetic resonance RF field in a magnetic resonance imaging system, the magnetic resonance imaging system comprising a main magnetic field apparatus and an object-bearing table, wherein the object-bearing table is movable relative to the main magnetic field apparatus and wherein a local coil system is arranged on, in, or on and in the object-bearing table, the local coil system comprising a plurality of local coils and a plurality of transmission elements, each local coil of the plurality of local coils including a portion of transmission elements of the plurality of transmission elements, wherein the transmission elements are configured to transmit the magnetic resonance RF field, the computer program product comprising one or more non-transitory computer-readable storage media having stored thereon instructions executable by one or more processors of a computing system configured as a programmable control apparatus, an image production unit, or both, to cause the computing system to perform operations comprising:

establishing a current location of the object-bearing table relative to the main magnetic field apparatus; and automatically connecting a set of transmission elements of the plurality of transmission elements based on the current location of the object-bearing table and a size of a patient target volume segment of a patient target volume in a measurement region at the current location of the object-bearing table, the patient target volume segment being an intersection between the patient target volume and the measurement region, the size of the patient target volume segment comprising a height extent and a transverse extent, wherein the height extent is a distance in a vertical direction relative to the object-bearing table and the transverse extent is a distance in a horizontal direction perpendicular to the height extent in a plane parallel to the object-bearing table.

12. The computer program product of claim 11, wherein the operations further comprise:

activating the set of transmission elements, wherein at least one activated transmission element of the set of transmission elements is a component of a different local coil of the plurality of local coils than the other activated transmission elements.

13. The computer program product of claim 11, wherein automatically connecting the set of transmission elements comprises connecting individual transmission elements of the plurality of transmission elements based on a position of a defined region of the object-bearing table relative to the measurement region, wherein a position of the measurement region is constant relative to the main magnetic field apparatus.

14. The computer program product of claim 13, wherein automatically connecting the set of transmission elements comprises connecting at least one transmission element of the plurality of transmission elements depending on a position relative to the target volume segment of the patient target volume of a patient in the measurement region.

15. The method of claim 1, wherein the local coil system is a transmission local coil system.

16. The method of claim 1, wherein the set of transmission elements comprises one or more transmission elements of the plurality of transmission elements of one or more local coils of the plurality of local coils.

17. The method of claim 1, wherein activating the set of transmission elements comprises activating less than all transmission elements of the respective portion of transmission elements of a local coil of the plurality of local coils.

18. The method of claim 11, wherein the set of transmission elements comprises one or more transmission elements of the plurality of transmission elements of one or more local coils of the plurality of local coils.

19. The method of claim 11, wherein connecting the set of transmission elements comprises connecting less than all transmission elements of the respective portion of transmission elements of a local coil of the plurality of local coils.

20. The method of claim 1, wherein a first part of the local coil system is arranged on the object-bearing table and second part of the local coil system is arranged underneath the first part of the local coil system, the first part of the local coil system comprising a first plurality of local coils, the second part of the local coil system comprising a second plurality of local coils, wherein each local coil of the first plurality of local coils and the second plurality of local coils includes a portion of transmission elements of the plurality of transmission elements, and wherein the set of transmission elements includes at least one transmission element of a first local coil of the first plurality of local coils and at least one transmission element of a second local coil of the first plurality of local coils.

* * * * *